United States Patent
Gipson (10) Patent No.: US 10,925,175 B2
(45) Date of Patent: Feb. 16, 2021

(54) COMPRESSION GASKET FOR AN ELECTRONIC ASSEMBLY

(71) Applicant: Dura Operating, LLC, Auburn Hills, MI (US)

(72) Inventor: Ron G. Gipson, Metamora, MI (US)

( * ) Notice: Subject to any disclaimer, the term of this patent is extended or adjusted under 35 U.S.C. 154(b) by 0 days.

(21) Appl. No.: 16/455,070

(22) Filed: Jun. 27, 2019

(65) Prior Publication Data

US 2020/0413553 A1 Dec. 31, 2020

(51) Int. Cl.
| H05K 1/00 | (2006.01) |
| H05K 1/18 | (2006.01) |
| H05K 7/00 | (2006.01) |
| H05K 5/02 | (2006.01) |
| H05K 5/00 | (2006.01) |

(52) U.S. Cl.
CPC ............ *H05K 5/02* (2013.01); *H05K 5/0004* (2013.01)

(58) Field of Classification Search
USPC ......................................................... 361/748
See application file for complete search history.

(56) References Cited

U.S. PATENT DOCUMENTS

| 6,362,433 B1* | 3/2002 | Takahashi | H05K 1/0346 |
| | | | 174/255 |
| 2015/0055353 A1* | 2/2015 | Hutchens | F16M 13/02 |
| | | | 362/370 |
| 2015/0098200 A1* | 4/2015 | Spangberg | H05K 7/1427 |
| | | | 361/752 |
| 2015/0131236 A1* | 5/2015 | Passmore | H05K 7/02 |
| | | | 361/728 |
| 2017/0082279 A1* | 3/2017 | Manahan | F21V 31/005 |

* cited by examiner

*Primary Examiner* — Andargie M Aychillhum
(74) *Attorney, Agent, or Firm* — Vivacqua Crane (57) ABSTRACT

An electronic assembly and a method of forming an electronic assembly. The electronic assembly including a printed circuit board including a perimeter; a compression gasket extending around at least a portion of the perimeter of the printed circuit board; and a housing including a first wall and a housing side wall extending from the first wall, the first wall and housing side wall form a cavity, wherein the printed circuit board and the compression gasket are located within the cavity with the compression gasket positioned between the perimeter and the housing side wall.

6 Claims, 5 Drawing Sheets

COMPRESSION GASKET FOR AN ELECTRONIC ASSEMBLY

FIELD

The present disclosure is directed to a compression gasket for use in an in-molded electronic assembly.

BRIEF DESCRIPTION

The statements in this section merely provide background information related to the present disclosure and may or may not constitute prior art.

Electronic assemblies may include a number of electrical components, such as printed circuit boards and electrical components mounted to or associated with the printed circuit boards, such as capacitors, chipsets and light emitting diodes. In addition, printed circuit boards, and the associated electrical components, may be encapsulated or mounted in a polymer material to provide a housing, protection for the circuit board or to act as a light guide for light emitting sources associated with the printed circuit board. Further, these electronic assemblies may become a part of larger assemblies. For example, the electronic assemblies may be mounted into other assemblies, such as automotive trim components, through processes, such as in-mold assembly, that use thermal or mechanical energy.

The printed circuit boards, however, are often dissimilar formed from materials that are dissimilar from the materials used to form the housing and trim components. Thus, the materials may exhibit different physical properties, such as volumetric expansion properties or compressive strength. These differing physical properties may lead to cracking or other warping of the printed circuit boards, housing, or automotive trim component.

Thus, while current electronic assemblies achieve their intended purpose, there is a need for a new and improved system and method for forming electronic assemblies.

SUMMARY

According to several aspects, an electronic assembly includes a printed circuit board having a perimeter. The electronic assembly further includes a compression gasket extending around at least a portion of the perimeter of the printed circuit board. The electronic assembly also includes a housing having a first wall and a housing side wall extending from the first wall, the first wall and housing side wall form a cavity, wherein the printed circuit board and the compression gasket are located within the cavity with the compression gasket positioned between the perimeter and the housing side wall.

In additional aspects, the printed circuit board exhibits a first linear coefficient of thermal expansion, the housing exhibits a second linear coefficient of thermal expansion, wherein the first and second linear coefficients of thermal expansion are dissimilar.

In further aspects, the electronic assembly includes a substrate, wherein the printed circuit board is connected to the substrate and the substrate extends past the housing side wall.

In additional aspects, the substrate is a film.

In further aspects, the printed circuit board includes a first face and the electronic assembly includes a filler component encapsulates at least a portion of the first face of the printed circuit board.

In additional aspects, the filler component provides at least a portion of the compression gasket.

In additional aspects, the compression gasket is formed from an elastomer material.

In additional aspects, the perimeter includes lateral side walls and the compression gasket is adjacent to at least a portion of at least one lateral side wall.

In additional aspects, the compression gasket is adjacent to the entire perimeter.

In additional aspects, the printed circuit board includes a first face and the cavity in the housing includes a ledge, wherein the ledge adjoins a portion of the first face of the printed circuit board near the perimeter of the printed circuit board.

In additional aspects, the printed circuit board includes a first face and the perimeter includes lateral side walls and the ledge adjoins a portion of the first face of the printed circuit board near the lateral side walls.

In additional aspects, the housing includes an exterior surface and at least one locating feature extends from the exterior surface.

Accordingly to several aspects, a trim panel assembly is provided. The trim panel assembly includes a support panel, the support panel including an exterior surface and a cavity defined in the exterior surface. The trim panel assembly further includes an electronic assembly located in the cavity. The trim panel assembly yet further includes a skin layer disposed on the support panel and the electronic assembly. The electronic assembly includes a printed circuit board including a perimeter. The electronic assembly further includes a compression gasket extending around at least a portion of the perimeter of the printed circuit board. The electronic assembly yet further includes a housing including a first wall and a housing side wall extending from the first wall, the first wall and housing side wall forming cavity, wherein the printed circuit board and the compression gasket are located within the cavity with the compression gasket positioned between the printed circuit board side wall and the housing side wall. The electronic assembly also includes a substrate positioned adjacent to the trim panel, wherein the printed circuit board is connected to the substrate.

In additional aspects, the cavity is defined by an opening extending through the support panel and a backing plate engaging the support panel.

In additional aspects, the housing includes an exterior surface and at least one locating feature extending from the exterior surface of the housing, wherein the at least one locating feature is received in at least one receiving feature in the cavity.

In additional aspects, the at least one locating feature is retained in the at least one receiving feature by an interference fit.

According to several aspects, a method of forming an electronic assembly is provided. The method includes arranging a compression gasket around at least a portion of a perimeter of a printed circuit board. The method further includes arranging a housing over the printed circuit board, wherein the housing includes a first wall and a housing side wall extending from the first wall, the first wall and housing side wall further defining an interior volume. In addition, the printed circuit board and the compression gasket are located within the interior volume with the compression gasket positioned between the printed circuit board side wall and the housing side wall.

In further aspects, the method includes over-molding at least a portion of the printed circuit board with filler component prior to arranging the housing over the printed circuit board.

In additional aspects, the filler component forms the compression gasket.

In further aspects, wherein the method includes affixing a substrate to the printed circuit board and affixing the substrate to the housing side wall.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application or uses.

The terms "exterior" and "interior" are terms used relative to the orientation of a vehicle 10 as shown in the drawings of the present application. Thus, "exterior" refers to the external portion of the vehicle and "interior" refers to the compartments within the body of the vehicle 10. The terms "first face", "second face", "lateral" and "longitudinal" are terms relative to the orientation of the printed circuit board as shown in the drawings of the present application. Thus, while the orientation of the printed circuit board as shown in the drawings may change with respect to a given use, these terms are intended to still apply relative to the orientation of the printed circuit board as shown in the drawings.

Figure 1:
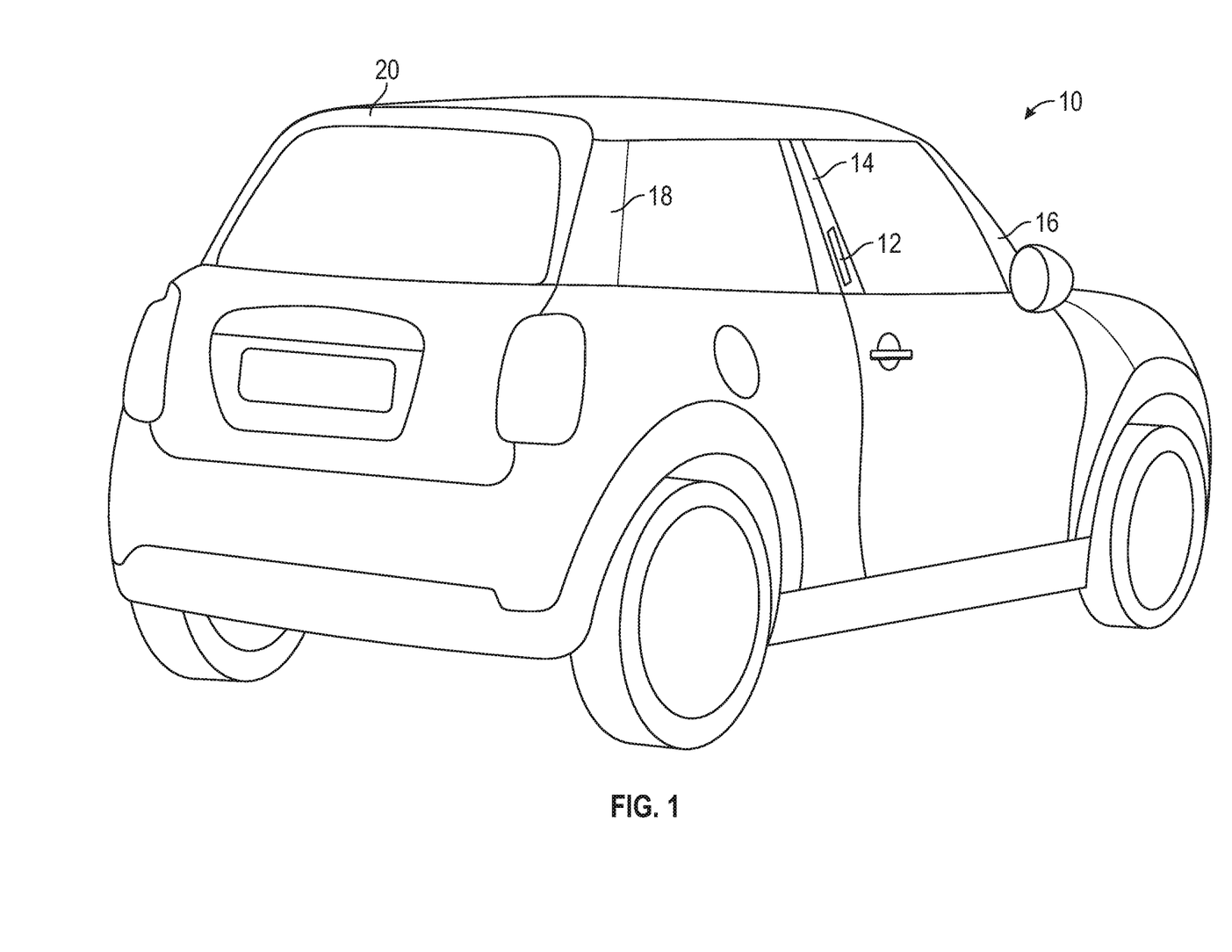
FIG. 1 is an illustration of a vehicle including a trim panel according to an exemplary embodiment.

Electronic assemblies may be used as operator interfaces on vehicles. Such interfaces may be interactive, where a human can interact with the vehicle to, for example, unlock or lock vehicle doors, open a trunk or hatch, determine the level of battery charge or amount of fuel available, determine vehicle alarm status, etc. FIG. 1 illustrates an example of a vehicle 10 including an electronic assembly 12 integrated into a trim panel assembly 22 (see FIG. 2) that provides the B-pillar trim panel 14. As illustrated, the vehicle is an automobile; however, it may be appreciated that electronic assemblies may be integrated into other vehicles, such as but not limited to personal and commercial trucks, motorcycles, aviation vehicles including helicopters and airplanes, and watercraft including boats and personal watercraft. Further, while FIG. 1 illustrates the electronic assembly 12 integrated into the B-pillar trim panel 14, electronic assemblies 12 may be integrated into other exterior trim components, such as the A-pillar trim panel 16, C-pillar trim panel 18, or spoiler trim panel 20 as well as interior trim components.

Figure 2:
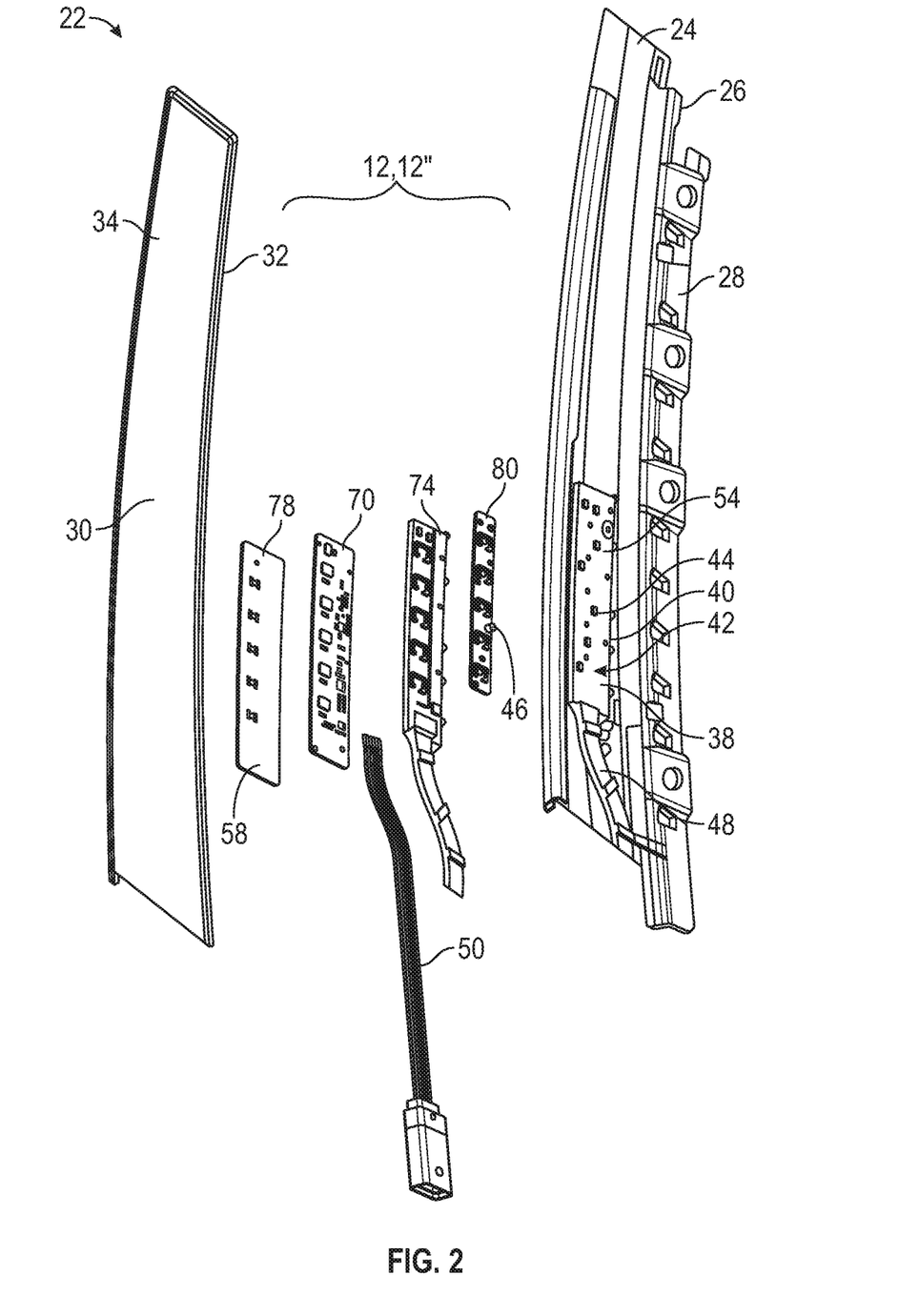
FIG. 2 is an illustration of a trim panel assembly according to an exemplary embodiment.

An exploded view of a trim panel assembly 22 providing the B-pillar trim panel 14 is illustrated in FIG. 2. The trim panel assembly 22 is illustrated as being curvate and oblong; however, it may be appreciated that the trim panel assembly 22 may assume any number of geometries. The trim panel assembly 22 includes the electronic assembly 12, 12" described further herein, a support panel 24, which includes an interior face 26 and an exterior surface 28, and a skin layer 30, which also includes an interior face 32 and an exterior surface 34.

The support panel 24 is formed from a polymer material and, in aspects, a thermoplastic polymer material such as acrylonitrile-butadiene-styrene (ABS), acrylonitrile styrene acrylate (ASA), polycarbonate, polyamide 6, polyethylene terephthalate, polybutylene terephthalate, co-polymers thereof, and blends thereof. In additional aspects, the support panel 24 is formed from an opaque material, which in further aspects may be understood as a material that transmits less than 5%, and as low as 0%, of incident electromagnetic waves in the visible range (380 nm to 800 nm) by, e.g., reflecting, absorbing, or scattering the incident electromagnetic waves. In various aspects, the support panel 24 provides structural support for the trim panel assembly 22.

As illustrated, the support panel 24 further defines a cavity 38 which includes an opening 40 at the exterior surface 28. The cavity 38 defines an interior volume 42 in which the electronic assembly 12, 12" is located. In aspects, the electronic assembly 12, 12" may be received in the cavity 38 and, in further aspects, the exterior surface 28 of the support panel 24 and the exposed portion of the electronic assembly 12, 12" form a continuous surface at the exterior surface 28 of the support panel 24. In aspects, there is no gap between the electronic assembly 12, 12" and the exterior surface 28 of the support panel 28. The cavity 38 may include at least one receiving feature 44 that receives at least one locating feature 46 of the electronic assembly 12, 12". It may be appreciated that a plurality of locating and receiving features 46, 44 may be provided, such as in the range of 1 to 10 of each feature. The receiving features 44 include, for example, blind holes, and the locating features 46 include, for example, bosses, which form an interference fit between them. Further, the support panel 24 defines a channel 48 that accommodates a wire harness 50 coupled to the electronic assembly 12, 12". The wire harness 50 may transmit power, data, or a combination thereof to and from the electronic assembly 12, 12" to one or more controllers (not illustrated) located throughout the vehicle 10. Further, in aspects, the cavity 38 of the support panel 24 may conform to the portion of the electronic assembly 12, 12" received in the cavity 38, wherein the surface 54 of the cavity 38 is adjoining, and in further aspects contiguous with, at least a portion of the exterior surface 56 of the electronic assembly 12.

The skin layer 30 is disposed over the support panel 24, wherein the interior face 32 of the skin layer 30 is disposed adjacent to the exterior surface 28 of the support panel 24. In aspects, the skin layer 30 is formed from translucent material, which may be understood as material that transmits more than 5% of incident electromagnetic waves in the visible range (380 nm to 800 nm), including all values and ranges from 5% to 100%, such as 50% to 99%, with or without (in the case of transparent material) diffusion of the light through the material. In additional or alternative aspects, the skin layer 30 is formed from poly(methyl methacrylate) (PMMA), polycarbonate (PC), polyurea, polyurethane, poly(ether ether ketone) (PEEK), polyetherimide, as well as blends thereof or co-polymers thereof. Further, in aspects, the skin layer 30 conforms to the support panel 24 and the portion 58 of the electronic assembly 12, 12" exposed by the cavity 38, wherein the interior face 32 of the skin layer 30 is adjoining, and in further aspects contiguous with, at least a portion of, if not all of, the exterior surface 28 of the support panel 24 and the exposed portion 58 of the electronic assembly 12, 12".

Figure 3:
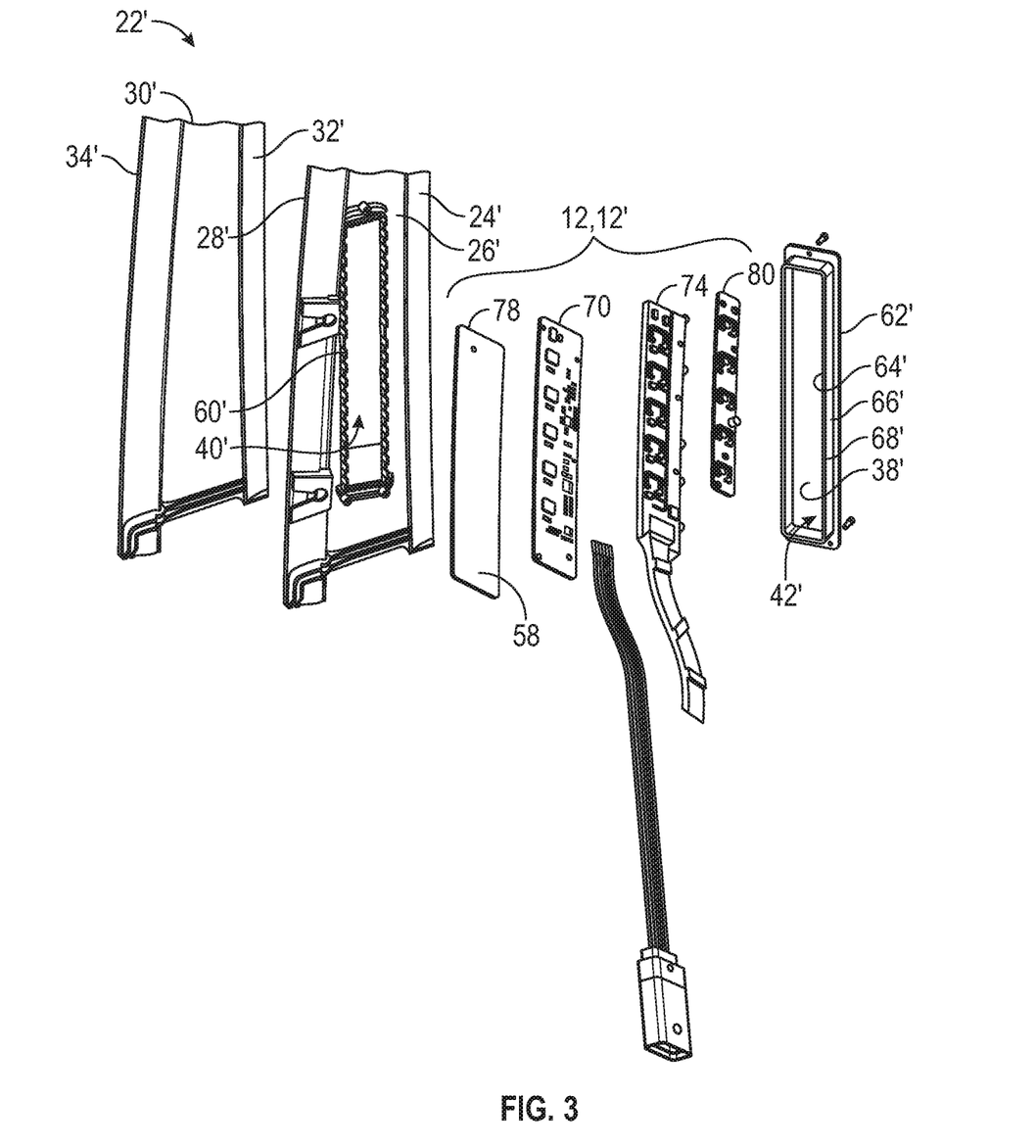
FIG. 3 is an illustration of a trim panel assembly according to an exemplary embodiment.

An exploded view of another aspect of a trim panel assembly 22' providing a B-pillar trim panel 14 is illustrated in FIG. 3. The trim panel assembly 22' is again illustrated as being curvate and oblong; however, it may be appreciated that the trim panel assembly 22' may assume any number of geometries. The trim panel assembly 22' includes an electronic assembly 12, 12" described further herein, a support panel 24', which includes an interior face 26' and an exterior surface 28', and a skin layer 30', which also includes an interior face 32' and an exterior surface 34'. The support panel 24' and skin layer 30' are similar in material and construction as support panel 24 and skin layer 30 of the trim panel assembly 22 described above with respect to FIG. 2.

In the aspect illustrated in FIG. 3, the support panel 24' includes an opening 40', which extends through the thickness of the support panel 24'. Surrounding the opening 40' and extending from and perpendicular to the interior face 26' of the support panel 24' is an undulating wall 60'. The wall 60' may alternatively be straight or exhibit different configurations. Further, a backing plate 62' is provided. The backing plate 62' includes two adjacent walls 64', 66' extending perpendicularly therefrom that form a slot 68' in which the undulating wall 60 is received. The backing plate 62' is affixed to the support panel 24' and the backing plate 62' defines a cavity 38' therein, which defines an interior volume 42'. It may be appreciated that other configurations of mechanically affixing the backing plate 62' to the support panel 24' are also contemplated herein. Again, the electronic assembly 12' is received in the cavity 38'.

As described above, the skin layer 30' is disposed over the support panel 24', wherein the interior face 32' of the skin layer 30' is disposed adjacent to the exterior surface 28' of the support panel 24'. In aspects, the skin layer 30' covers the opening 40' and covers the electronic assembly 12, 12''' received in the cavity 38'. In aspects, the skin layer 30' conforms to the support panel 24', wherein the interior face 32' of the skin layer 30' is contiguous with the exterior surface 28' of the support panel 24'.

Figure 4A:
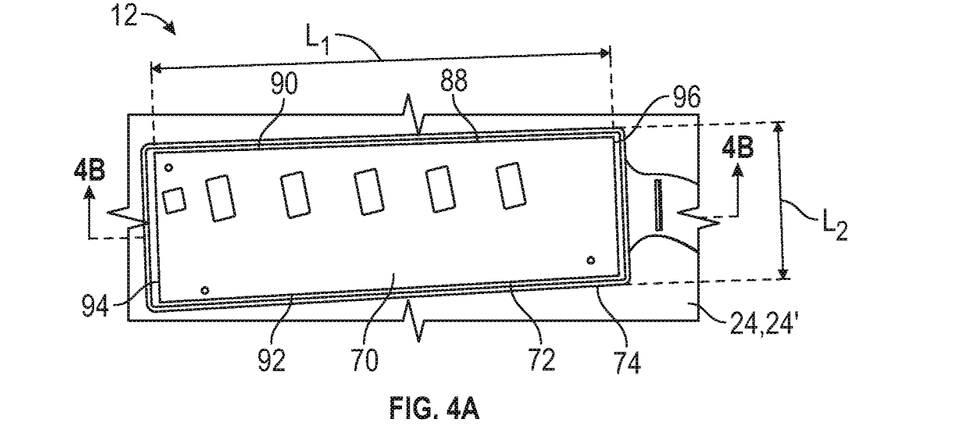
FIG. 4A is an illustration of an electronic assembly according to an exemplary embodiment.
Figure 4B:
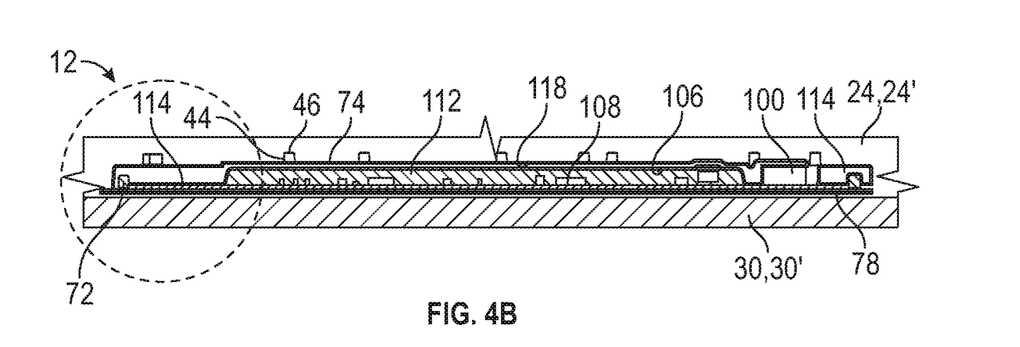
FIG. 4B is an illustration of a cross-section along the length of the electronic assembly of FIG. 4A according to an exemplary embodiment.
Figure 4C:
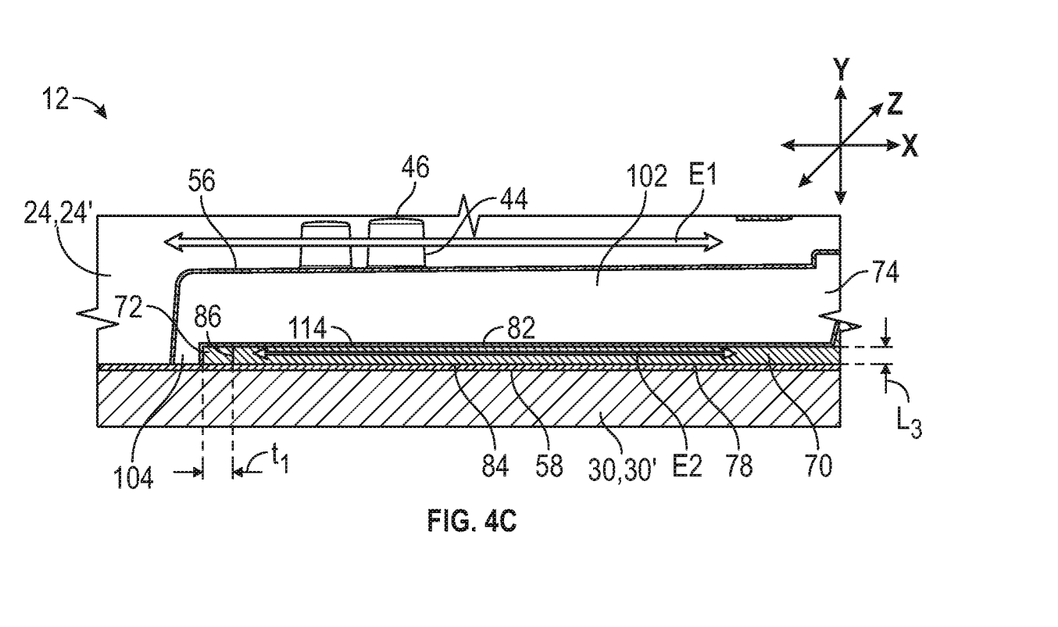
FIG. 4C is a close-up of cross-section of FIG. 4B at a lateral side of the printed circuit board.

Reference is now made to FIGS. 4A through 4C, which illustrate an electronic assembly 12. The electronic assembly 12 includes a printed circuit board 70, a compression gasket 72, a housing 74 and, in optional aspects, a liquid polymer resin 76. A substrate 78 is also provided as is a wire harness 50 that may be soldered or attached to the printed circuit board 70. In aspects, a reflector 80 may also be provided.

The printed circuit board 70 includes a first face 82, a second face 84, and a side wall 86 (see FIG. 4C) joining the first face 82 and the second face 84 at the perimeter 88 (see FIG. 4A) of the printed circuit board 70. In aspects, the faces 82, 84 of the printed circuit board 70 are oblong including opposing longitudinal sides 90, 92 and opposing lateral sides 94, 96 (see FIG. 4A). As illustrated, the longitudinal sides 90, 92 exhibit a length L1 that is greater than the length L2 of the lateral sides 94, 96. In aspects, the longitudinal length L1 is, for example, in the range of 1 cm to 10 cm, including all values and ranges therein, and the lateral length L2 is, for example, in the range of 0.5 cm to 5 cm, including all values and ranges therein. However, it may be appreciated that other configurations are contemplated, such as square, oval or circular. The length L3 of the side wall 86 (or thickness of the printed circuit board) is understood to be less than the length L1, L2 of either the longitudinal sides 90, 92 and lateral sides 94, 96, wherein the length L3 of the side wall 86 may be in the range of 0.5 mm to 3 mm, including all values and ranges therein. The printed circuit board 70 may be formed from, e.g., laminate materials including a fabric or paper encapsulated by a resin. The fabric maybe formed from a woven or non-woven material, such as glass fiber or one or more polymer fibers. The encapsulating resin may include, for example, phenolic formaldehyde, epoxy or polyester. Examples of printed circuit boards may include but are not limited to FR1, FR2, FR3, FR4, CEM-1, CEM-3, flex or rigid-flex.

The compression gasket 72 extends around at least a portion of the perimeter 88 of the printed circuit board 70 and adjacent to the side wall 86. In aspects, a compression gasket 72 is positioned along at least a portion of the lateral sides 94, 96 and in further aspects a compression gasket 72 is positioned along the entire length of the lateral sides 94, 96. In additional aspects, the compression gasket 72 is positioned around the entire perimeter 88 of the printed circuit board 70. In aspects, the compression gasket 72 is a stand-alone gasket; and in alternative aspects the compression gasket 72 is formed on the printed circuit board 70. In aspects, the compression gasket exhibits a thickness t1 in the range of 0.25 mm to 2 mm in thickness, including all values and ranges therein.

The compression gasket 72 is formed from a compressible material, which may be understood as a material that exhibits deformation, i.e., strain, upon the application of compressive force. In aspects, the compressible material is also viscoelastic and recovers with little to no permanent deformation upon the removal of an applied load. Compression gasket materials include foam, rubber, or elastomers, such as, for example, natural rubber, silicon rubber, polybutadiene, polyisobutylene, p-phenylenediamine based polymers, polyurethanes, thermoplastic elastomers such as polyester thermoplastic elastomer, fluoroelastomers, polyether ester elastomers, etc. In aspects, the compression gasket material exhibits a Shore D durometer in the range of 40 to 85 including all values and ranges therein.

The printed circuit board 70 and compression gasket 72 are positioned within the housing 74. The housing 74 provides a light guide for a light emitting source 100, such as an LED, that is associated with or connected to the printed circuit board 70. The housing 74 includes a first, primary wall 102 and a periphery, side wall 104 that extends from the primary wall 102. The primary wall 102 and side wall 104 form a cavity 106 defining an interior volume 112 therein. In aspects, the compression gasket 72 is positioned between the printed circuit board 70 and the housing 74. In aspects, the housing 74 exhibits a height in the range of 3.5 mm to 5.5 mm in thickness, including all values and ranges therein.

The housing 74 is formed from a translucent material, which may be understood as material that transmits more than 5% of incident electromagnetic waves in the visible range (380 nm to 800 nm), including all values and ranges from 5% to 100%, such as 50% to 99%, with or without (in the case of transparent material) some degree of diffusion of the light through the material. In additional or alternative aspects, the housing 74 is formed from poly(methyl methacrylate) (PMMA), polycarbonate (PC), polyurea, polyurethane, poly(ether ether ketone) (PEEK), polyetherimide, as well as blends thereof or co-polymers thereof. In aspects, the housing 74, and specifically the cavity 106, includes a ledge 114 which adjoins, and in further aspects is contiguous with, at least a portion of the first face 82 of the circuit board 70. As illustrated, the cavity 106 includes a ledge 114 near the lateral sides 96, 98 of the printed circuit board 70.

In aspects, the printed circuit board 70 includes a number of electrical components 108 extending therefrom that enable the functionality of the printed circuit board 70, such as capacitors, transistors, resistors, processors, communication ports, light emitters 100, and memory storage chips. The housing 74 cavity 106 may provide an interior volume 112 to allow clearance to accommodate the electrical components 108. As noted above, the housing 74 includes at least one ledge 114 in the cavity 106. When assembled, the ledge 114 adjoins the first face 82 of the printed circuit board 70 near all or a portion of the perimeter 88 of the circuit board 70, such as near the lateral sides 96, 98 of the printed circuit board 70. As illustrated in FIGS. 4B and 4C. The ledge 114 spaces the electrical components 108 on the printed circuit board 70 from the upper surface 108 of the cavity 106 to prevent component 108 damage.

Figure 5A:
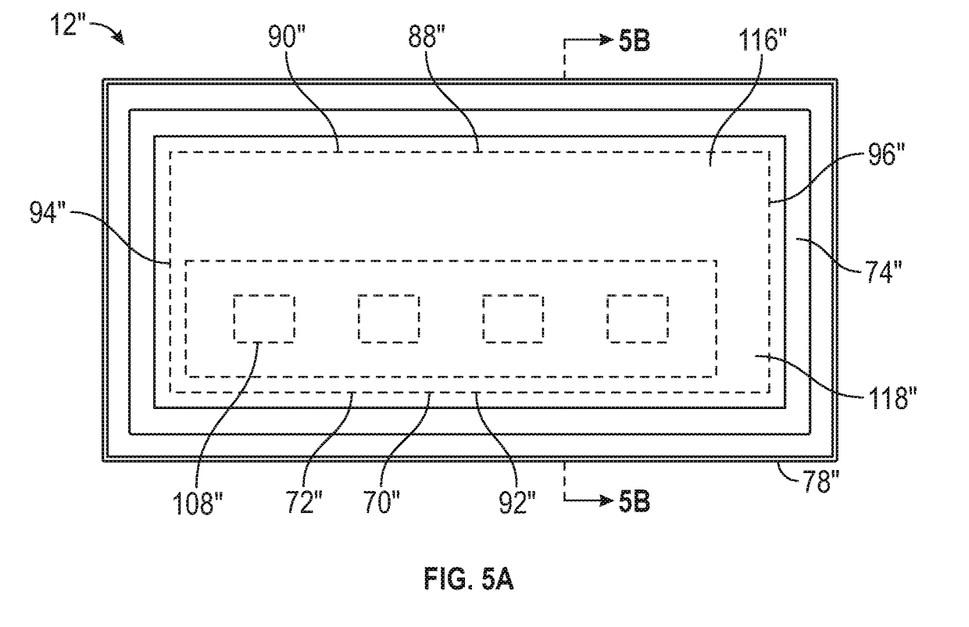
FIG. 5A is an illustration of an electronic assembly according to an exemplary embodiment.
Figure 5B:
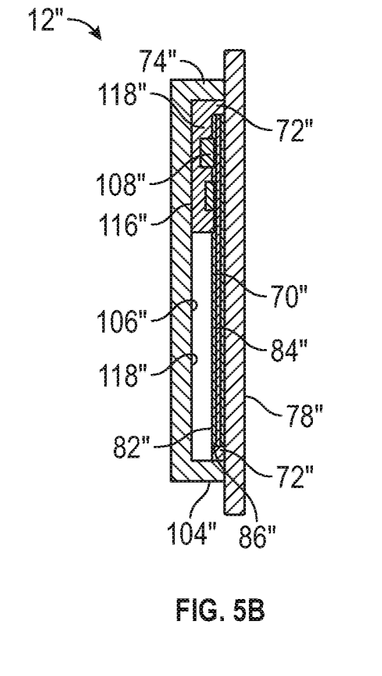
FIG. 5B is a cross-section of an electronic assembly according to an exemplary embodiment.

In further aspects, illustrated in FIGS. 5A and 5B, a filler component 116" is disposed on the first face 82" of the printed circuit board 70", encapsulating the electrical components 108" on the printed circuit board 70. The filler component 116" conforms to the interior volume 112" between the first face 82" and the upper surface 118" of the cavity 106". The filler component 116" may also be present between the second face 84" of the printed circuit board 70" and the substrate 78". Similar to the electronic assembly 12 illustrated in FIGS. 4A through 4C, the electronic assembly 12" includes a printed circuit board 70", a compression gasket 72", and a housing 74". The materials and characteristics of the printed circuit board 70" and housing 74" are the same as those noted above with respect to FIGS. 4a through 4c. In the illustrated aspect, the filler component 116" is also used to form the compression gasket 72", which may be formed when the electrical components 108" are encapsulated or after the electrical components 108" are encapsulated. The compression gasket 72" may, alternatively, be the same as described with regard to FIGS. 4A through 4C, noted above.

The filler component 116" is a low-pressure molding resin which, in aspects, is a polymer material that exhibits a melt temperature in the range of 120° C. to 260° C., including all values and ranges therein, such as 230° C. to 240° C. In aspects, the polymer material provides a relatively low coefficient of linear thermal expansion, such as in the range of 175 ppm/° C. to 220 ppm/° C. as tested according to ASTM 696-98, including all values and ranges therein, such as 195 ppm/° C. The polymer material may further exhibit an injection pressure in the range of 0.1 to 20 MPa, including all values and ranges therein, including in further embodiments 0.1 MPa to 3.5 MPa, at or above melt temperature and below degradation temperature. The low pressure molding resins may also exhibit a viscosity in the range of 240 centipoise to 375 centipoise including all values and ranges therein, wherein the viscosity is tested according to ASTM 3236 (RTV spindle 27). Polymer materials include, but are not limited to polyamide, polyolefin and polyurethane rubber hot melt resin. It may be appreciated that the coefficient of linear thermal expansion may be selected so as to reduce pulling or shearing of the electrical components 108, 108" off the printed circuit board 60 when exposed to elevated temperatures. It may further be appreciated that the filler component prevents the components from being crushed during further molding and assembly steps and prevents infiltration of other materials molded over the electronics assembly into the assembly housing. Further, the filler component may remove air cavities and prevent water and moisture accumulation within the electronic assembly.

With reference again to FIGS. 2, 4A through 4C, 5A and 5B, a substrate 78, 78" is provided in the electronic assembly 12, 12". In aspects, the substrate 78, 78" is coupled to the second face 84, 84" of the printed circuit board 70, 70" and the substrate 78, 78" is at least coextensive with the housing 74, 74". In additional aspects, at least a portion of the substrate 78, 78" extends past, or outward of, the side wall 104, 104" of the housing 74, 74". Further, the printed circuit board 70, 70" is enclosed within the housing 74, 74" and substrate 78, 78, wherein the side walls 104, 104" extend down around the perimeter 88, 88" of the printed circuit board 70, 70" and compression gasket 72, 72". In aspects, the side walls 104, 104" and the substrate 78, 78" are adhered together with an adhesive or they are contiguous. In further aspects where the compression gasket 72, 72" is over molded on the printed circuit board 70, 70", the compression gasket 72, 72" adheres to the substrate 78, 78" affixing the substrate 78, 78" to the second surface of the printed circuit board 70, 70" around the perimeter 88, 88" of the printed circuit board 70, 70". In aspects, the substrate 78, 78" is a film, formed from, e.g., poly(methyl methacrylate) (PMMA) or polyurea, polyurethane. In aspects, the film has a thickness in the range of 0.05 mm to 10 mm, including all values and ranges therein. When positioned in a trim panel assembly 22, 22' the substrate 78, 78" provides the exposed portion 58 of the electronic assembly 12, 12" in the trim panel assembly 22, 22' and is mounted adjacent to the skin layer 30, 30".

It is noted that when the filler component 116" provides the compression gasket 72, 72" and adheres the substrate 78, 78" to the printed circuit board 70, 70"; adhesive that may otherwise be used to adhere the substrate 78, 78" to the printed circuit board 70, 70" or housing 74, 74" may be omitted. Further, over molding of the filler component 116" and providing the compression gasket 72 72" with the filler component 116" allows for relatively accurate location of the substrate 78, 78" and eliminates an assembly step. It is also noted that using the filler component 116" as the compression gasket 72, 27" prevents the infiltration of, e.g., additional over molded materials, such as material used to form the support panel 24 if the support panel 24 is molded onto the electronic assembly 12".

Thermal expansion and contraction causes an expansion or contraction in the length of the housing 74, 74" and printed circuit board 70, 70' in the direction of the arrows X,Y and Z illustrated in FIG. 4C as temperatures to which the electronic assembly 12, 12" is exposed to deviates from room temperature, i.e., 20° C. to 23° C. It is understood that the deviation in length in a given direction (e.g., X, Y or Z) is proportional to the original length and the change in temperature the electronic assembly is exposed to and is referred to as the linear coefficient of thermal expansion. Linear deviations due to thermal expansion may occur at temperature in the range of 23° C. or greater, including all values and ranges therein, such as in the range of 25° C. to 80° C. Linear deviations due to thermal contraction may occur at temperatures in the range of below 20° C., including all values and ranges therein, such as in the range of −40° C. to 20° C. In aspects, the linear coefficient of thermal expansion of the printed circuit board 70, 70" differs from that of the housing 74, 74" material, wherein the linear coefficient of thermal expansion of the housing 74, 74" material is greater than that of the printed circuit board 70, 70". For example, the printed circuit board 70, 70" may exhibit a linear coefficient of thermal expansion in the range of 1 μm/(m*° C.) to 75 μm/(m*° C.) when below the glass transition temperature of the material encapsulating the printed circuit board 70, 70", including all values and ranges therein, and the housing 74, 74" may exhibit a linear coefficient of thermal expansion in the range of 80 μm/(m*° C.) to 120 μm/(m*° C.) at temperature of 40° C., including all values and ranges therein. In yet a further example, the housing 74, 74" may exhibit a calculated expansion in the range of 0.5 mm to 0.7 mm, including all values and ranges therein, and the printed circuit board 70, 70" exhibits a calculated expansion in the range of 0.05 mm to 1.5 mm at a temperature of 85° C. Thus, in aspects, at temperatures of 85° C., the linear expansion exhibited by the housing 74, 74" E1 may be 2 to 10 times that the linear expansion E2 exhibited by the printed circuit board 70, 70" relative to the initial length of the housing 74, 74" and printed circuit board 70, 70" at 21° C. The compression gasket 72, 72" accommodates for the thermal expansion and contraction of the printed circuit board 70, 70" and housing 74, 74" upon exposure of the electronic assembly 12, 12" to temperatures deviating from room temperature, i.e., 20° C. to 23° C.

Figure 6:
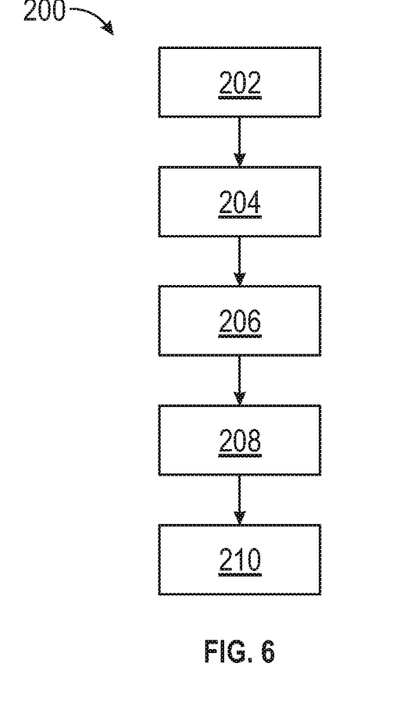
FIG. 6 is a flow chart of a method according to an exemplary embodiment.

A method of forming the electronic assembly 12, 12" is illustrated in FIG. 6 and with further reference to FIGS. 2 through 5B. In aspects, the method 200 includes at block 202 affixing the printed circuit board 70, 70", including electrical components 108, 108", to the substrate 78, 78". In further aspects, the second face 84, 84" of the printed circuit board 70, 70" is affixed to the substrate 78, 78" by over-molding the substrate 78, 78" onto the printed circuit board 70, 70", such as by injection molding or casting. Alternatively, or in addition, an adhesive may be used to connect the substrate 78, 78" to the printed circuit board 70, 70". The adhesive may be carried on a tape or applied as a liquid directed to either the printed circuit board 70, 70" or to the substrate 78, 78".

At block 204 the compression gasket 72, 72" is arranged around the perimeter 88, 88" of the printed circuit board 70, 70" and the wire harness 50 is coupled to the printed circuit board 70, 70". In aspects, the compression gasket 72, 72" is formed and then positioned around the printed circuit board 70, 70" or the compression gasket 72, 72" is over-molded onto the printed circuit board 70, 70" side wall 86, 86" and onto the substrate 78, 78". Where the compression gasket 72, 72" is formed and then positioned around the printed circuit board 70, 70", the compression gasket 72, 72" may be retained by an interference fit with the printed circuit board 70, 70" or by applying an adhesive to either the printed circuit board 70, 70", the compression gasket 72, 72", or both. In further aspects, the compression gasket 72, 72" is over-molded onto the printed circuit board 70, 70", the compression gasket 72, 72" forms a contiguous surface with the printed circuit board 70, 70".

At block 206, the housing 74, 74" is then arranged on the printed circuit board 70, 70". In aspects, the housing 74, 74" is molded and then secured over the printed circuit board 70, 70"; and, in further aspects secured to the substrate 78, 78". In various aspects, an adhesive is used to secure the housing 74, 74" to the printed circuit board 70, 70", particularly between the ledge 114, 114" and the first face 82, 82" of the printed circuit board 70, 70" or between the side wall 104, 104" of the housing 74, 74" and the substrate 78, 78". In alternative aspects, the housing 74, 74" is over-molded onto the printed circuit board 70,70" and the compression gasket 72, 72'''. It may be appreciated that in alternative aspects, steps 206 and 204 may be reversed, wherein the housing 74, 74" may be mounted on the printed circuit board 70, 70" and the compression gasket 72, 72" may be placed between the printed circuit board 70, 70" and the housing 74, 74".

In further aspects and with particular reference to FIGS. 5A and 5B, at block 208, the filler component 116" is introduced between the housing 74" and the printed circuit board 70" to encapsulate the electrical components 108". In aspects, the filler component 116" is introduced in a port 115" formed in the housing 74". While a separate compression gasket 72" may be employed, in further aspects, the filler component 116" may be used to form the compression gasket 74". In such steps, block 204 of arranging the compression gasket 72" around the printed circuit board 70" may be omitted. In alternative aspects, the filler component 116" may be formed around the electrical components 108" before mounting the housing 74" to the printed circuit board 70".

At block 210, the electronic assembly 12, 12" is arranged in the support panel 24, 24' to provide the trim panel assembly 22, 22'. In aspects, the support panel 24 is over-molded onto the electronic assembly 12, 12" and specifically over-molded around the electronic assembly 12, 12" housing 74, 74". The flow of the support panel 24 material around the housing 74, 74" and locating features 46 extending from the housing 74, 74" in aspects provides a contiguous interface between the housing 74, 74" and the support panel 24, 24', such that a bond may be formed between the support panel 24, 24' and the housing 74, 74". A cavity 38 is then defined in the support panel 24, 24' by the housing 74, 74". Further, receiving features 44 may be formed in the support panel 24, 24' by the locating features 46 of the housing 74, 74".

In alternative aspects, at block 210, the electronic assembly 12, 12" is inserted into a cavity 38 provided in a previously molded support panel 24, 24'. That is, the support panel 24, 24' is molded with a cavity 38 in which the electronic assembly 12, 12" is inserted. Alternatively, the electronic assembly 12, 12" is inserted into a cavity 38' of a backing plate 62' that is then affixed to the support panel 24'.

In the above aspects of block 210, the electronic assembly 12, 12" may be mechanically retained in the cavity 38, 38' by an adhesive, by an interference fit between the receiving features 44 and locating features 46 or by an interference fit between the housing 74, 74" and surfaces 54, 64' in the cavity 38, 38'.

At block 212, the skin layer 30, 30' is arranged over the electronic assembly 12, 12" and the support panel 24, 24'. In aspects, the skin layer 30, 30' is over-molded onto the support panel 24, 24'. In alternative aspects, the skin layer 30, 30' is preformed, such as by injection molding, and then fastened to the support panel 24, 24' either mechanically, with an adhesive, or both mechanically and with an adhesive. If the cavity 38 is formed within the support panel 24, as illustrated in FIG. 2, then the electronic assembly 12, 12" is inserted into the cavity 38 prior to forming the skin layer 30 or assembling the skin layer 30 over the support panel 24. If the cavity 38' is affixed to the support panel 24', as illustrated in FIG. 3, then the skin layer 30' may be formed or arranged on the support panel 24' either before or after the electronic assembly 12, 12" is inserted into the cavity 38'.

Reference to over-molding in the method above is understood as a process where the underlying component, such as a printed circuit board 70, 70" is inserted into a mold and material is flowed over the component within the mold, such as by injection molding, transfer molding or casting.

It may be further be appreciated that in a method of deploying an electronic assembly described herein, the electronic assembly is exposed to heat, such in the form of elevated environmental temperatures in the range of 25° C. to 85° C., including all values and ranges therein, or in the form of electromagnetic radiation emitted by the sun or other radiative sources. The printed circuit board and housing expand, wherein such expansion between the printed circuit board and housing is dissimilar, i.e., unequal, as described above. The compression gasket is then compressed between the printed circuit board and housing. Upon exposure to reduced temperatures below 20° C., such as in the range of −40° C. to 19° C., the housing and printed circuit board may linearly contract, wherein such contraction is dissimilar between the printed circuit board and housing, releasing strain that may be present on the compression gasket. Again, the electronic assembly may be incorporated into a trim panel and exposed An electronic assembly of the present disclosure offers several advantages. These include the use of a compression gasket for the compensation of different linear and volumetric expansion coefficients exhibited by the printed circuit board and housing, particularly at elevated temperatures.

The description of the present disclosure is merely exemplary in nature and variations that do not depart form the gist of the present disclosure are intended to be within the scope of the present disclosure. Such variations are not to be regarded as a departure from the spirit and scope of the present disclosure.

What is claimed is:

1. A trim panel assembly, comprising:
    a support panel, the support panel including an exterior surface and a panel cavity defined in the exterior surface;
    an electronic assembly located in the cavity, the electronic assembly including
        a printed circuit board including a perimeter and having a first face,
        a compression gasket extending around and in contact with at least a portion of the perimeter of the printed circuit board,
        a housing including a first wall and a housing side wall extending from the first wall, the first wall and housing side wall forming a cavity, wherein the printed circuit board and the compression gasket are located within the cavity with the compression gasket positioned between the perimeter and the housing side wall, and
        a substrate positioned adjacent to the support panel, wherein the printed circuit board is connected to the substrate and the housing side wall is in contact with the substrate; and
        wherein the first wall contacts the first face of the printed circuit board at the perimeter and the cavity is disposed above the first face within the perimeter;
    a skin layer disposed on the support panel and the electronic assembly.

2. The trim assembly of claim 1, wherein the panel cavity is defined by an opening extending through the support panel and a backing plate engaging the support panel.

3. The trim assembly of claim 1, wherein the housing includes an exterior surface and at least one locating feature extending from the exterior surface of the housing, wherein the at least one locating feature is received in at least one receiving feature in the panel cavity.

4. The trim assembly of claim 3, wherein the at least one locating feature is retained in the at least one receiving feature by an interference fit.

5. The trim assembly of claim 1, wherein the substrate is in contact with the skin layer.

6. The trim assembly of claim 1, wherein the substrate is sandwiched between the printed circuit board and the support panel.

* * * * *